United States Patent [19]

Kenney

[11] Patent Number: 5,414,656

[45] Date of Patent: May 9, 1995

[54] LOW CHARGE CONSUMPTION MEMORY

[76] Inventor: Donald M. Kenney, 18 Birch Rd., Shelburne, Vt. 05482

[21] Appl. No.: 216,611

[22] Filed: Mar. 23, 1994

[51] Int. Cl.$^6$ .................................................. G11C 7/00
[52] U.S. Cl. ..................................... 365/149; 365/203; 365/210
[58] Field of Search ................ 365/149, 210, 203, 204

[56] References Cited

U.S. PATENT DOCUMENTS

| | | | |
|---|---|---|---|
| 4,203,159 | 5/1980 | Wanless | 365/149 X |
| 4,593,382 | 6/1986 | Fujishima et al. | 365/149 |
| 4,896,294 | 1/1990 | Shimizu et al. | 365/149 |
| 4,935,896 | 6/1990 | Matsumura et al. | 365/149 X |

OTHER PUBLICATIONS

Kazuyasu Fujishima et al., IEEE J. Solid State Circuits, vol. SC-17, No. 5, Oct. 1982, "A Storage Mode Boosted RAM with Word Line Delay Compensation," pp. 872-876.

Masahazu Aoki et al., IEEE J. Solid State Circuits, vol. 24, No. 5, Oct. 1989, "A 1.5V DRAM for Battery Based Applications," pp. 1206-1212.

Primary Examiner—Joseph A. Popek

[57] ABSTRACT

A dynamic random access memory is improved by a storage node precharge circuit so as to obtain both high stored voltage level and low charge consumption from a power supply. High voltage levels are written via the precharge circuit. Subsequently, low voltage levels are written via the access transistors and bit lines. As a result, the magnitude of the storage node voltage swing is independent of the magnitude of the bit line voltage swing. A given memory design may therefore be optimized independently for high stored voltage level and low bit line charge consumption.

9 Claims, 10 Drawing Sheets

LOW CHARGE CONSUMPTION MEMORY

FIELD OF INVENTION

This invention relates to a semiconductor memory array of the dynamic random access (DRAM) type in which a very low rate of electric charge consumption from the power supply is achieved.

BACKGROUND OF THE INVENTION

For over two decades DRAM technology has steadily progressed to ever larger bit storage capacity per chip. Use of large conventional arrays and low current CMOS peripheral circuits has resulted in array operation becoming the primary category of electrical charge consumption per bit stored. At the same time, battery powered portable DRAM applications have become a major market in which stringent charge conservation is required. Even in non battery equipment, large array charging current causes detrimental voltage fluctuations. Thus, a clear need has emerged for techniques to reduce array charge consumption as a means to extend battery life and reduce voltage variations.

Masakazu Aoki et al. have described one such technique in a paper in the IEEE Journal of Solid State Circuits, Vol. 24, No. 5, October, 1989, pp 1206–1212, "A 1.5 V DRAM for Battery Based Applications." The method utilizes the "plate pulse" technique (See U.S. Pat. No. 4,593,382 issued Jun. 3, 1986 to Fujishima et al.) combined with a small bit line voltage swing. In conventional DRAM arrays most charge consumption is for bit line voltage swing (Vbs) and is essentially proportional to Vbs×Cb where Cb is the bit line capacitance. The original plate pulse technique of Fujishima, and the low charge method of Aoki, both achieve a storage node voltage swing of approximately Vbs+Vps, where Vps is the plate voltage swing. In general, DRAM data sensing signal is directly proportional to node voltage swing. Hence, Aoki et al. sacrifice substantial sense signal when they minimize bit line voltage swing in order to minimize array charge consumption. The consequences of inadequate DRAM signal are well known, and include poor product test yield and high data soft error rate. Aoki attempts to recover signal by boosting the plate voltage swing. This necessarily introduces higher voltage stress on devices and degrades overall performance unless expensive additional design and fabrication measures are taken. Therefore, a need exists for a technique which allows both low array charge consumption and high stored voltage to be obtained without boosting.

Fujishima et al. (i.e. U.S. Pat. No. 4,593,382 cited above.) also describe a commonly used dummy cell, or reference cell, in their recital of prior art (See their FIG. 1 reference numeral 3). The reference cell contains a second transistor not present in any of the memory cells. Reference cells do not store data, or binary levels, and serve only to provide a fixed reference signal for comparison with binary data signals from memory cells. Generally, DRAM reference signal is set by design so as to be midway between the high and low signals expected for memory binary data levels.

SUMMARY OF THE INVENTION

An object of the present invention is to provide dynamic memory arrays which achieve both high stored voltage and low charge consumption from a power supply.

A further object is that the arrays be essentially the same physical size per bit as conventional DRAM arrays.

Another object is that conventional DRAM fabrication technology can serve to manufacture the memory arrays.

In order to achieve the above objects according to the present invention, a storage node precharge circuit is provided by which a high storage node data level is first written into a cell from a source other than a bit line. Subsequently, if required, a low storage node data level is written via a bit line. Thus, the magnitude of the storage node voltage swing is made independent of the magnitude of the bit line voltage swing. A give DRAM design can then be optimized independently for high stored voltage and low bit line charge consumption.

BRIEF DESCRIPTION OF THE DRAWINGS

FIG. 2b is a simplified constructional cross section from FIG. 2a.

FIGS. 3(a–f) is a first example of operating waveforms for the memory device of FIG. 1.

FIGS. 4(a–f) to 6(a–f) are additional examples of operating waveforms for the memory device of FIG. 1.

FIG. 8b is a simplified constructional cross section from FIG. 8a.

FIGS. 9(a–f) and 10(a–f) are examples of operating waveforms for the memory device of FIG. 7.

REFERENCE NUMERALS IN THE DRAWINGS 21 conventional one transistor dynamic memory cell
22 sense amplifier
23 reference cell
24 bit line
25 access word line
27 precharge word line
28 plate line
29 precharge voltage line
30 storage node precharge circuit
40 conventional thick dielectric isolation region
41 storage node plate
42 bit line contact
43 storage node contact
44 conductive connection between N and P type diffusions
45 isolation trench
46 isolation trench filler material
47 isolation trench dielectric liner
48 dielectric between conductive elements
50 semiconductor region

DETAILED DESCRIPTION OF THE PREFERRED EMBODIMENTS

Figure 1:
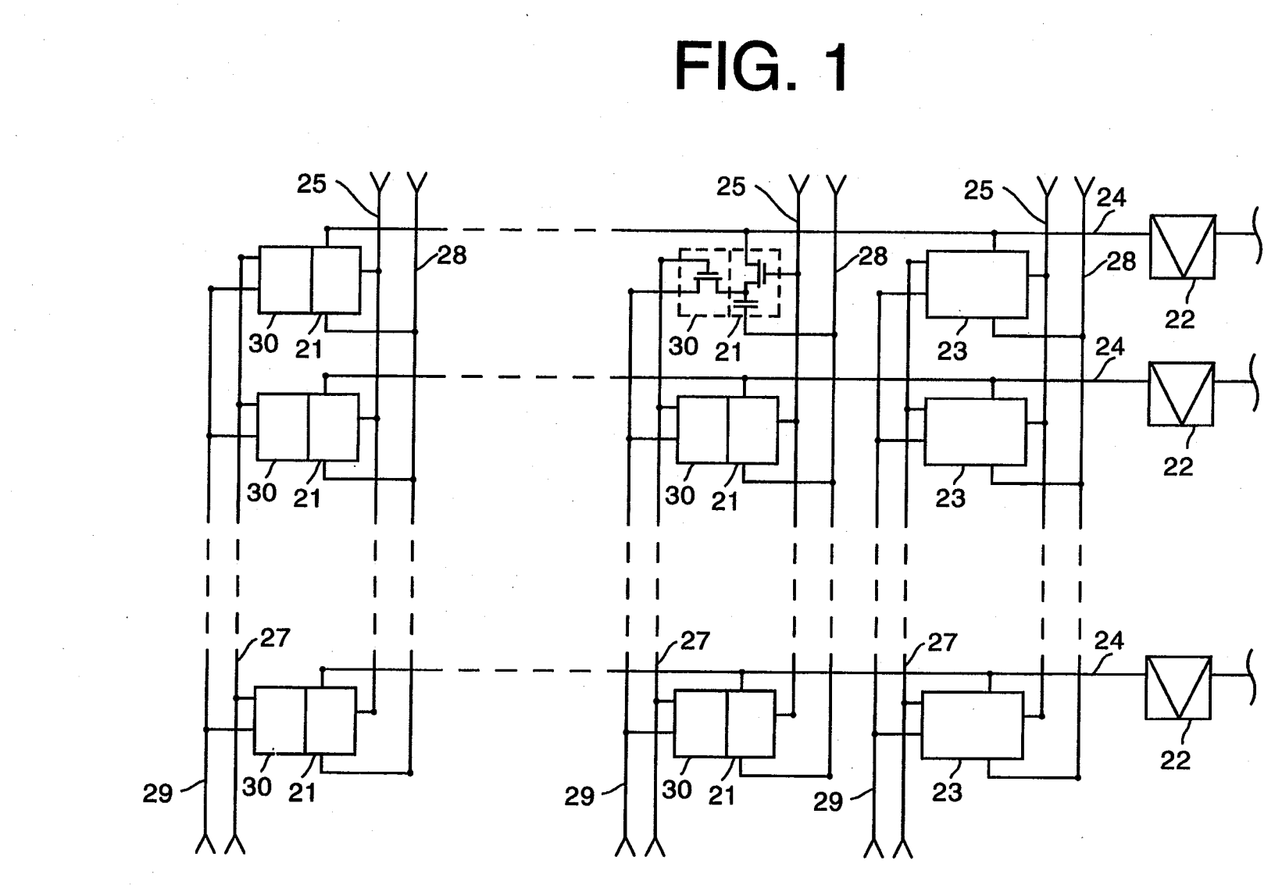
FIG. 1 is a schematic circuit diagram showing a first embodiment of a dynamic memory device according to the present invention.

FIG. 1 shows a first embodiment of the dynamic memory according to the present invention. Conventional one transistor dynamic memory cells 21 are in an array having bit lines 24 and access word lines 25. Each bit line is serviced by a reference cell 23 and a sense amplifier 22. Those skilled in the art will recognize FIG. 1 depicts the sense amplifiers and left half of a complete array of cells. A mirror image half array of memory cells and reference cells, not shown, is understood to exist to the right of the sense amplifiers. The storage node capacitor reference plates are integral with the plate lines 28 and connected to either a fixed reference potential or an actively driven voltage source, depending on the mode of operation as explained later. A storage node precharge circuit 30 having a precharge transistor is connected to each memory cell. It is operated by a precharge word line 27 and a precharge voltage line 29. For simplicity, reference cells 23 are assumed herein to be similar to memory cells 21, but of half the storage capacitance, and also served by storage node precharge circuits, but they may be of any other suitable design and operation.

Figure 2A:
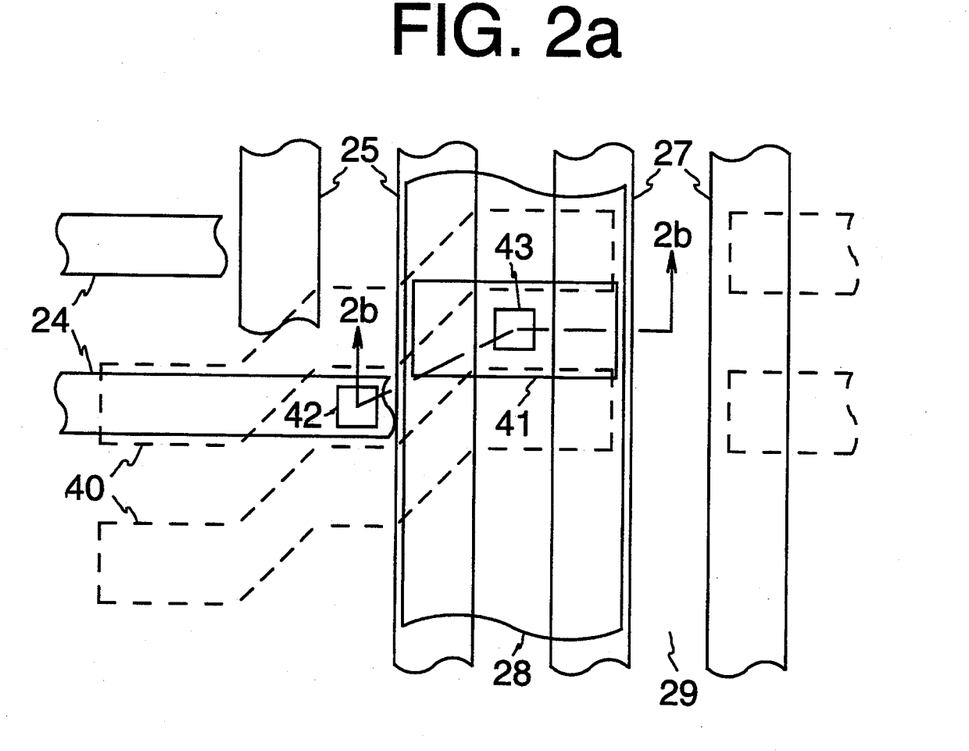
FIG. 2a is a top view of one physical layout of a portion of the circuit diagram of FIG. 1.
Figure 2B:
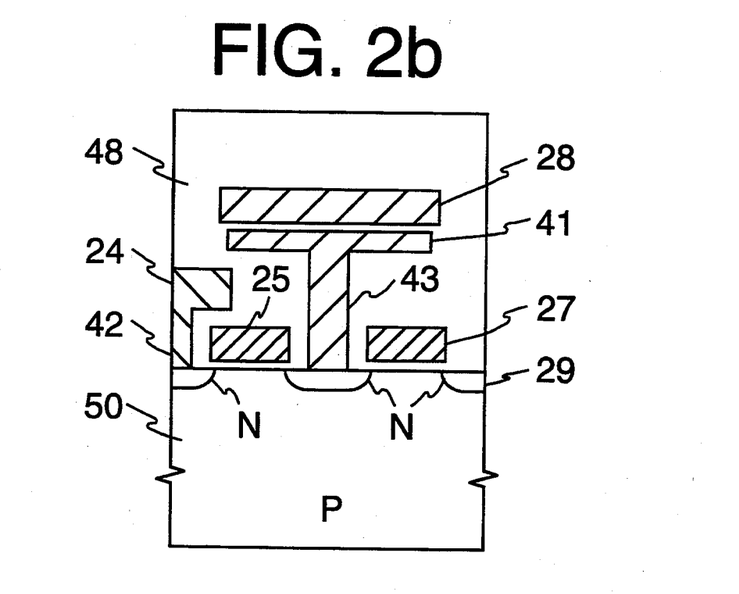

Those skilled in the art will understand many physical layouts and constructions of the dynamic memory of the present invention are possible. FIG. 2a is an illustrative top view illustration of one possible layout using conventional polycrystalline silicon gate and plate technology. Only a small portion of the repetitive array is shown, detailing one dynamic memory cell and precharge circuit. FIG. 2b is a simplified constructional cross section indicated in FIG. 2a. Returning to FIG. 2a, conventional thick dielectric isolation regions 40 in the semiconductor are shown in dashed outline. Areas outside the closed dashed outlines are known in the art as active areas, and may serve as transistor channel regeions or source and drain regions. The storage node plate 41 of the cell capacitor is shown as a stacked capacitor type, but other types could also be used. Any of the capacitor area enhancing methods such as cylindrical or fin construction and rough or porous silicon could be used. The bit line contact 42 and storage node contact 43 for one cell are indicated. The precharge voltage line 29 is shown as a diffused strip between adjacent precharge word lines 27. All word lines, plate lines, precharge voltage lines, etc. can be enhanced for performance purposes by use of silicides and metal strap lines. These common conductance enhancing features are omitted from the figures for simplicity. In FIG. 2b various dielectric regions 48 separate conductive elements. The semiconductor 50 contains conventional regions of N and P type doping.

Binary data levels are written into the dynamic memory according to the present invention by a general two part procedure. First, high voltage data levels are written on all cell storage node plates along a selected word address using the storage node precharge circuits 30. Second, low voltage data levels are written, as required, at each bit address along the same word address, using the access word line 25 and the bit lines 24. A vital consequence of this procedure is that all stored high voltages are derived from the precharge circuits, and all stored low voltages are derived from the bit lines. Therefore it is not necessary to charge bit lines to a full high storage voltage level, and charge consumption by bit lines is substantially reduced relative to conventional DRAM operation. Several variations of operation for the first embodiment of the present invention will now be discussed in turn. Half capacitance reference cells can be operated similarly and will not be described. All operating waveforms can be generated by conventional NMOS or CMOS circuit designs commonly used in DRAM products.

Figure 3:
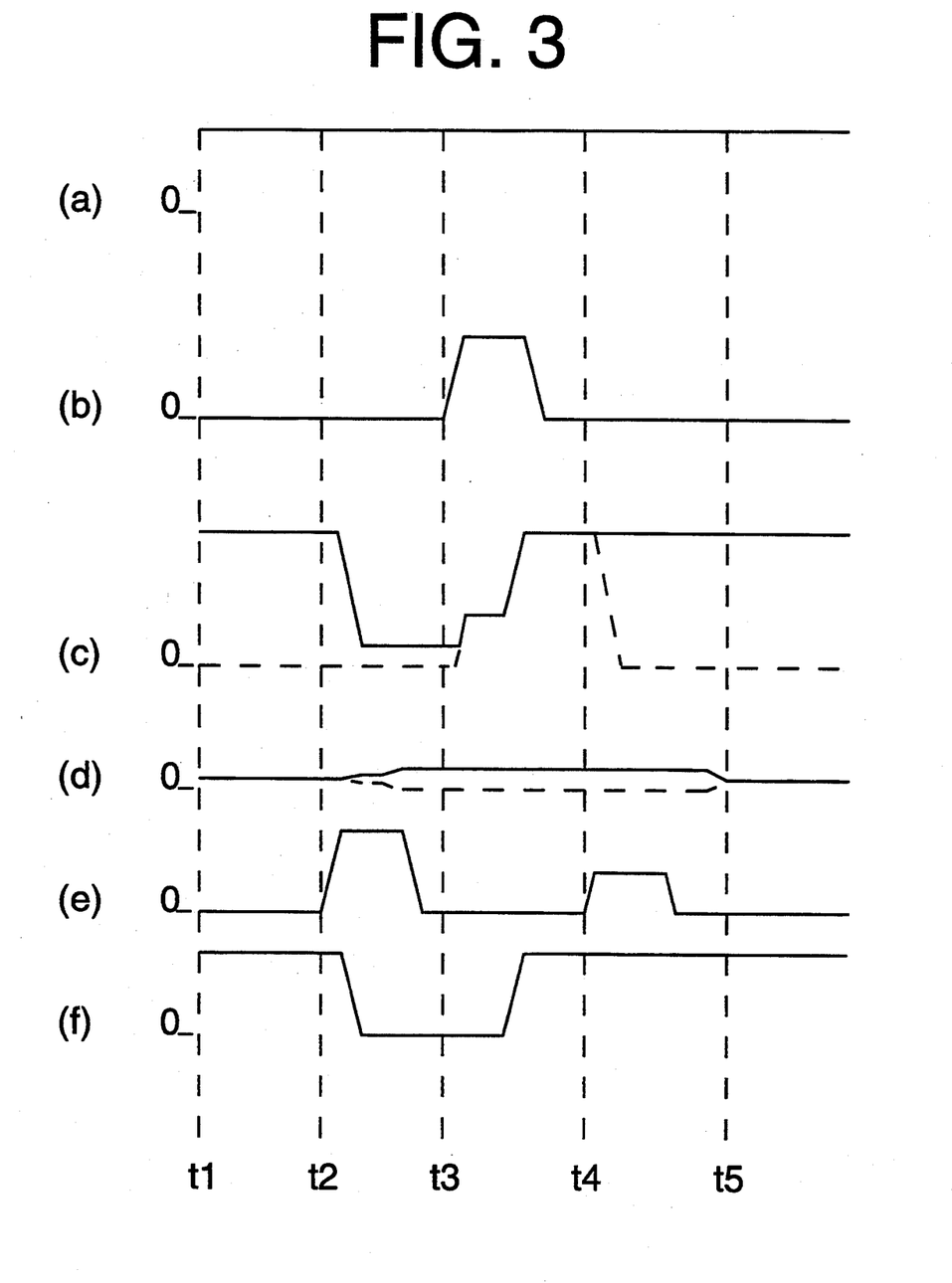

FIG. 3 shows one example of operating waveforms for the present invention. This example is characterized by use of a constant high level precharge voltage in FIG. 3a. During time interval t1-t2 the memory is in standby mode awaiting the next data access cycle or data refresh cycle. During standby the data level on any given storage node is either a high or low voltage level as indicated in FIG. 3c by the horizontal solid and dashed lines respectively. The bit line standby voltage level, FIG. 3d, is intermediate between bit line high and low voltage data levels to be discussed below. The precharge word line, FIG. 3b, and access word line, FIG. 3e, are at low (i.e. off) levels. The plate line, FIG. 3f, is at a high level. Thus, binary data voltage levels are held on the storage nodes during standby and no array operations take place.

FIG. 3 time interval t2-t3 illustrates a data read operation. Data levels stored on memory capacitors along a selected word address are connected to bit lines by biasing the access word line to a high level, FIG. 3e. The sense amplifiers are set shortly thereafter, driving the bit lines to their respective high or low voltage data levels. The two bit line data levels are indicated by horizontal solid and dashed lines in FIG. 3d. Note the bit line high voltage data level is a lower voltage than the storage node high voltage data level. This is possible because the storage node high level is not derived from the bit line, but rather, from the storage node precharge circuit and plate line coupling as described below. The bit line data levels can be sensed and set using conventional CMOS sense amplifier operation as illustrated in Aoki et al. previously referenced. Any other suitable method of sense amplifier operation and bit line control could also be used. It is generally preferred, but not necessarily essential, that the plate line, FIG. 3f, make its high level to low level transition while the access word line is high. This will prevent storage nodes from being coupled below ground potential, and thereby avoid excessive leakage current.

The standby and read time intervals described thus far have been essentially conventional except for the presence of the precharge circuit which has been biased to an off condition. The precharge circuit is used during the WRITE HIGHS time interval, t3-t4 of FIG. 3. First, the precharge word line sharing the previously selected word address is driven high at time t3 in FIG. 3b. Both high and low storage nodes charge via precharge transistors to a common intermediate level during the middle of the t3-t4 time interval as shown in FIG. 3c. This level is essentially the precharge word line voltage minus the precharge transistor threshold voltage. After the precharge word line reaches its high level the plate line is driven high in FIG. 3f, coupling all associated storage nodes to a high voltage data storage level in FIG. 3c. This completes writing high levels in all cells along the selected word address. The plate line is shown in FIG. 3f as making its transition to a high level during the t3-t4 write highs interval. Alternatively, the transition could be delayed until the t4-t5 interval during the WRITE LOWS access word line pulse described below. The transition should be completed before the fall of the write lows access word line pulse, however.

The memory cycle is completed during WRITE LOWS time interval t4-t5 of FIG. 3 by writing low levels along the selected word address as required. This is accomplished by pulsing the access word line at time t4 in FIG. 3e. The word line pulse level is controlled at less than an access transistor threshold voltage above a high level bit line, and more than an access transistor threshold voltage above a low level bit line. This will selectively discharge storage nodes on low level bit lines to the required low level via their access transistors, FIG. 3c. Storage nodes on high level bit lines remain high because the controlled word line pulse does not turn on their access transistors. At time t5 the memory returns to the standby condition. An unconventional definition of access transistor threshold voltage can be made for purposes of the write lows operation according to the present invention. The threshold can be defined as the maximum gate to bit line voltage difference which will not significantly discharge a high node level onto a high level bit line within the duration of the write lows access word line pulse. This specialized definition will assure proper operation over a somewhat wider voltage range than a conventional threshold definition. A significant discharge would typically be over one percent, or over ten percent, depending on how much stored high voltage loss is considered tolerable.

Note the high stored voltage level achieved in FIG. 3 is equivalent to that achieved by Fujishima et al. referenced previously, and is accomplished without boosting any array voltages other than the storage node itself. Note also the FIG. 3 bit line voltage swing can be as small as used by Aoki et al., but that Aoki resorted to a boosted plate line voltage to achieve a stored level comprable to Fujishima. Therefore, the present invention produces a superior combination of dynamic memory array operating characteristics not previously available.

Figure 4:
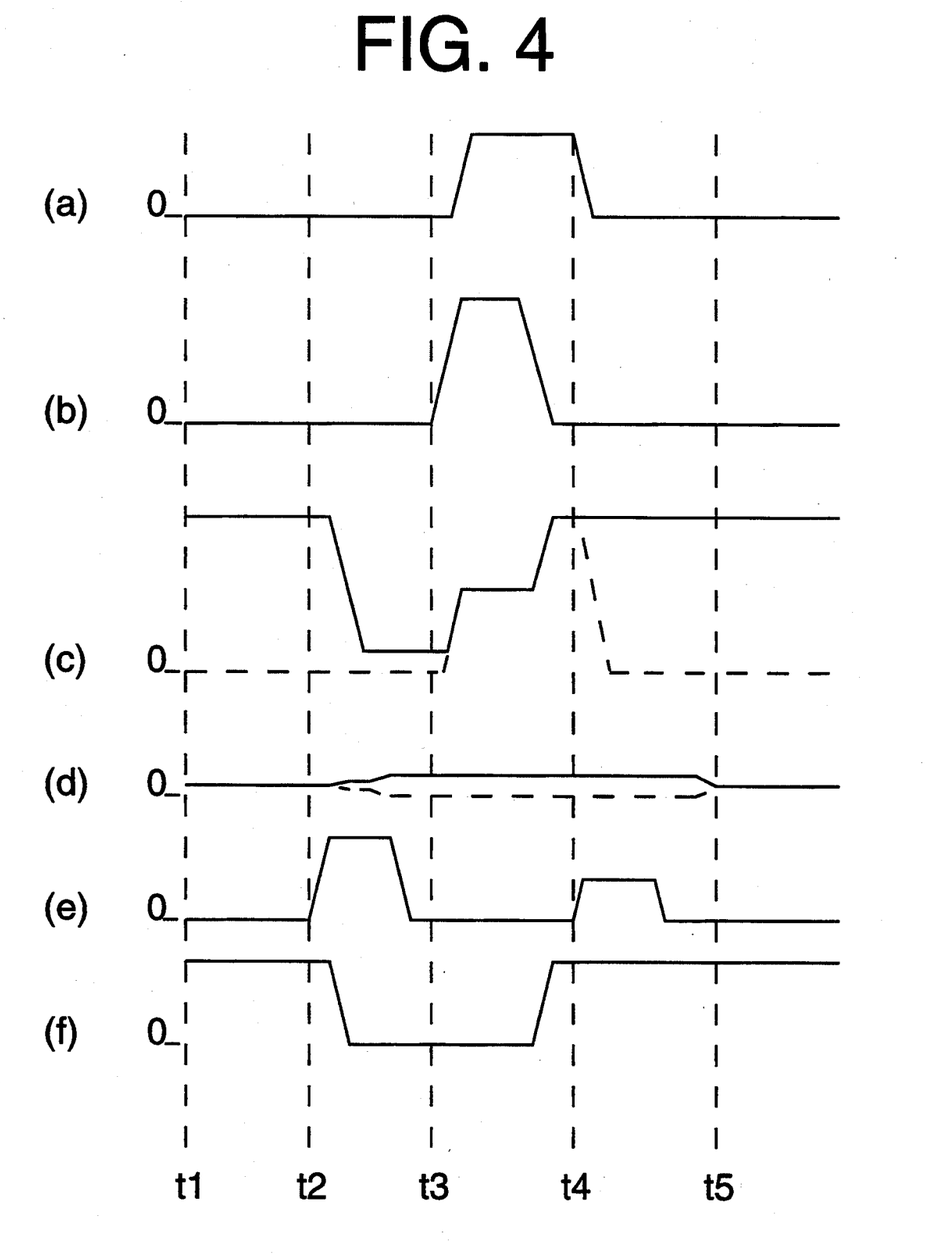

FIG. 4 illustrates a modification of the operating waveforms of FIG. 3. This example is characterized by use of a pulsed precharge voltage source, FIG. 4a. Overall operation is the same as that just described above for FIG. 3, except during the t3-t4 write highs interval. The precharge voltage pulse begins after the rise of the precharge word line pulse, and boosts the precharge word line in FIG. 4b above the level reached in FIG. 3b. The boosted level causes storage nodes to precharge to high voltage in FIG. 4c than was obtained in FIG. 3c. Note increased stored voltage is obtained without passing boosted voltage thru word driver circuits. Thus, increased voltage stress on transistors in those circuits is minimal. The FIG. 4 operating example produces higher stored voltage than obtained by Fujishima et al., and features low bit line voltage swing for low bit line charge consumption.

Those skilled in the art will recognize higher stored voltage levels can be obtained with the present invention by use of boosted precharge circuit and plate line voltage sources. As with the method of Aoki et al., however, the attendent higher voltage stress on devices will degrade overall performance unless expensive additional design and fabrication measures are taken. The feature of low bit line swing would still be realized, however.

Figure 5:
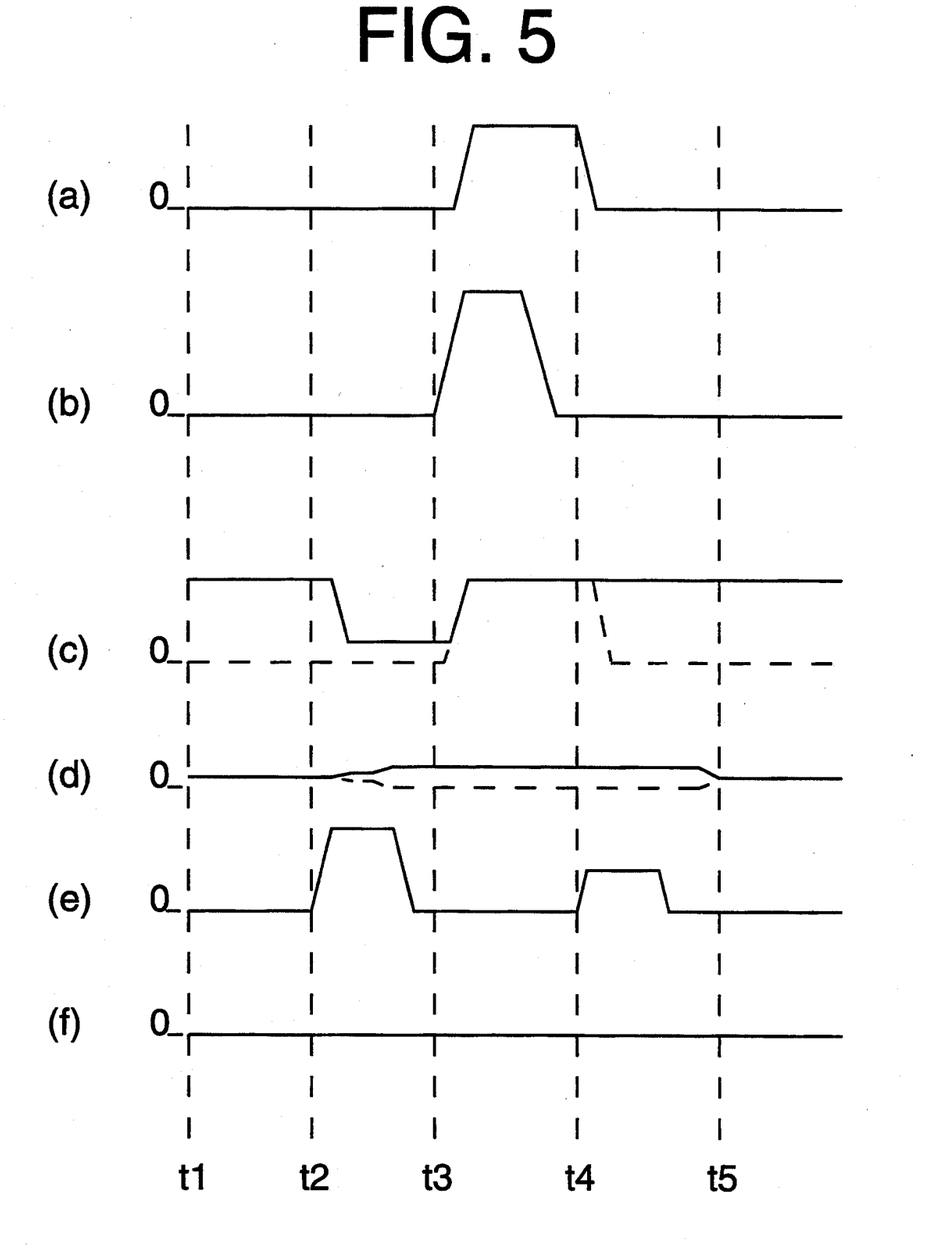

FIG. 5 illustrates a modification of the operating wave forms of FIG. 4. This example differs in that the plate line is maintained at a constant voltage level. Overall operation is the same as that just described above for FIG. 4 except that no upward coupling of storage node levels by the plate line occurs. Clearly, boosted precharge circuit voltage sources could be used to increase stored high levels. The adverse consequences of boosted levels indicated previously would again apply. Those skilled in the art will discern a constant voltage plate line need not be configured as a line at all, and a conventional two dimensional plate connected the entire array could be used.

Figure 6:
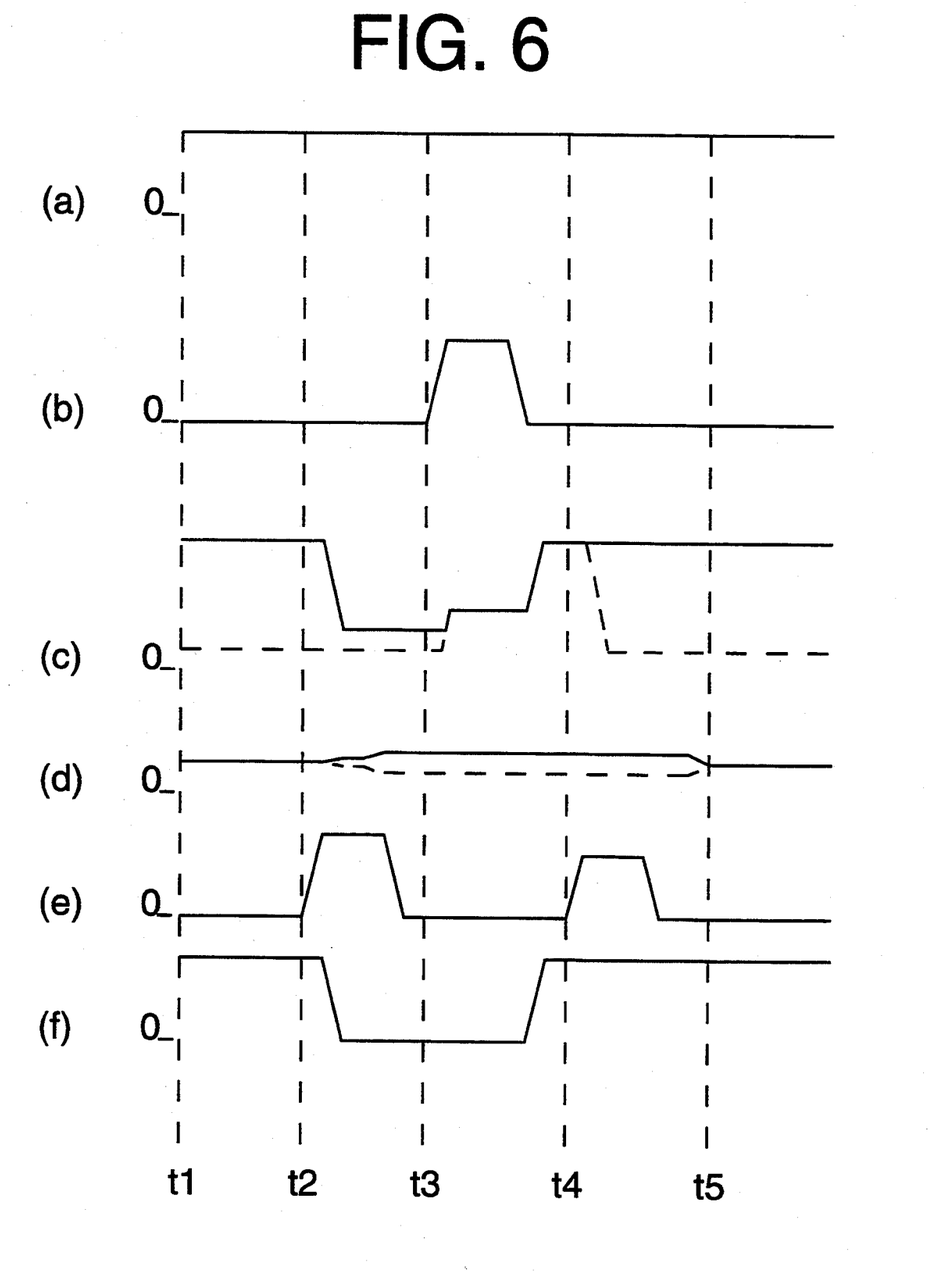

FIG. 6 illustrates another modification of the operating waveforms of FIG. 3. This example differs primarily in that the bit line operating voltages are all shifted upward so the bit line is always biased above ground potential. The change keeps all memory array PN junctions reverse biased at all times, even if no array back bias other than ground is applied. Therefore, the conventional back bias generator used in DRAM arrays to prevent noise induced forward bias of array junctions is not needed, and can be eliminated to further reduce charge consumption. Of course, some storage node voltage swing (signal) is lost as a consequence of holding the bit line above ground potential. The access word line voltage pulse during interval t4-t5 in FIG. 6e is again controlled at less than an access transistor threshold voltage above a high level bit line and more than an access transistor threshold voltage above a low level bit line. This provides for selective writing of low levels with the shifted bit line voltages.

All the operating examples of FIG. 3 through FIG. 6 are described using a bit line standby voltage level that is intermediate between the high and low bit line data levels. Clearly other suitable standby levels, such as the bit line data high level, could be used instead.

Figure 7:
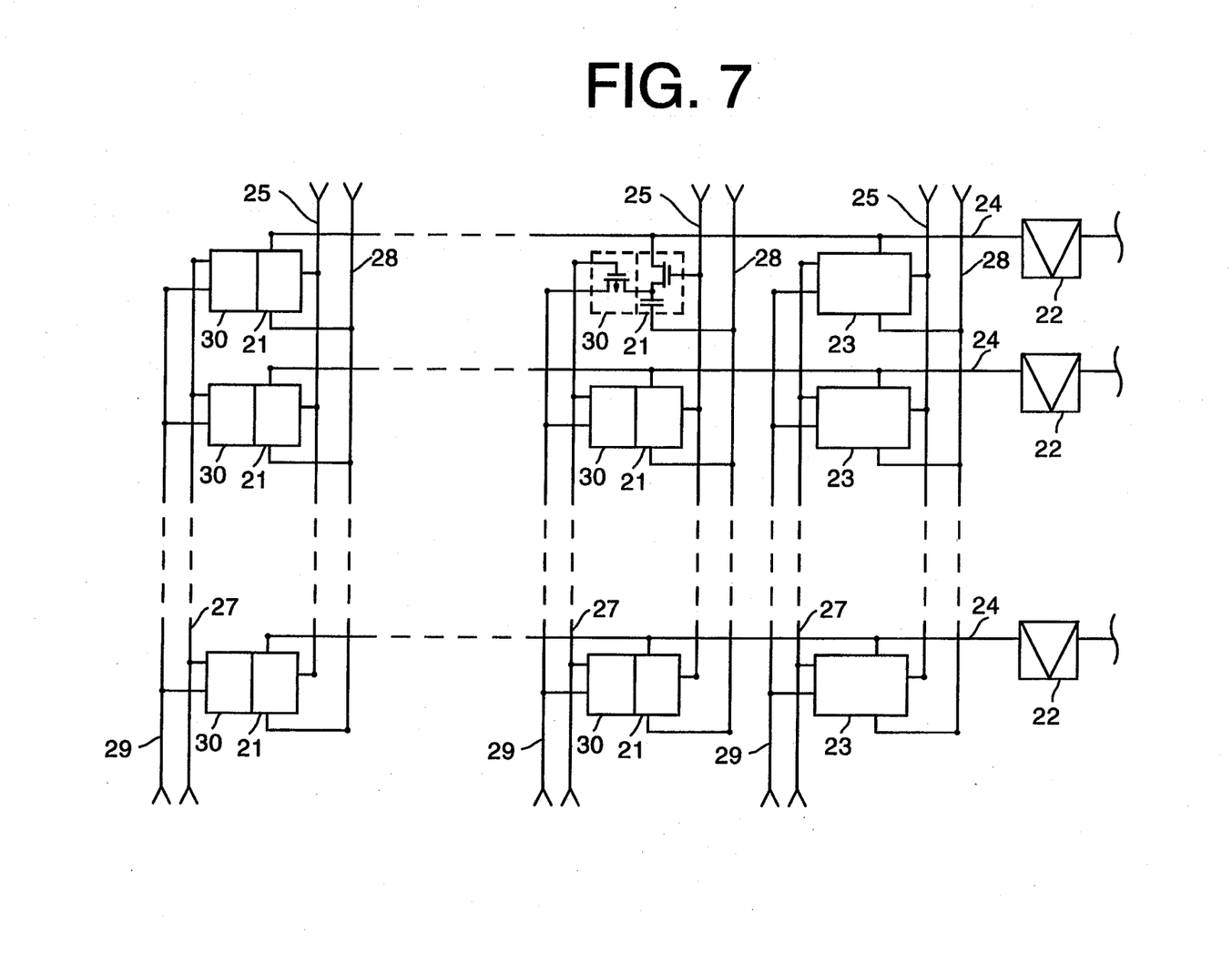
FIG. 7 is a schematic circuit diagram showing a second embodiment of a dynamic memory device according to the present invention.
Figure 8A:
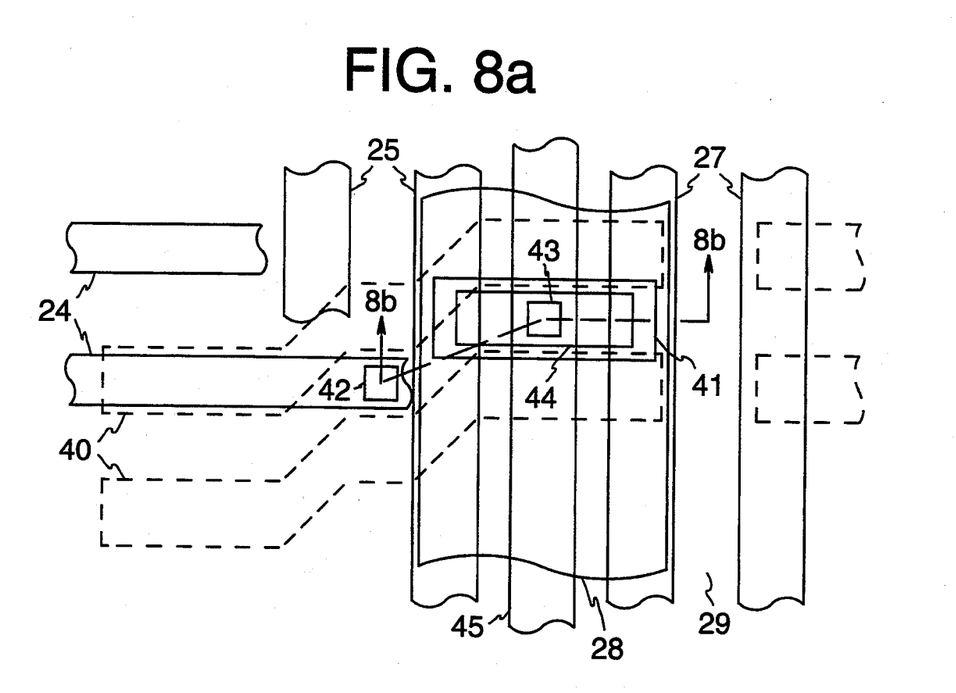
FIG. 8a is a top view of one physical layout of a protion of the circuit diagram of FIG. 7.
Figure 8B:
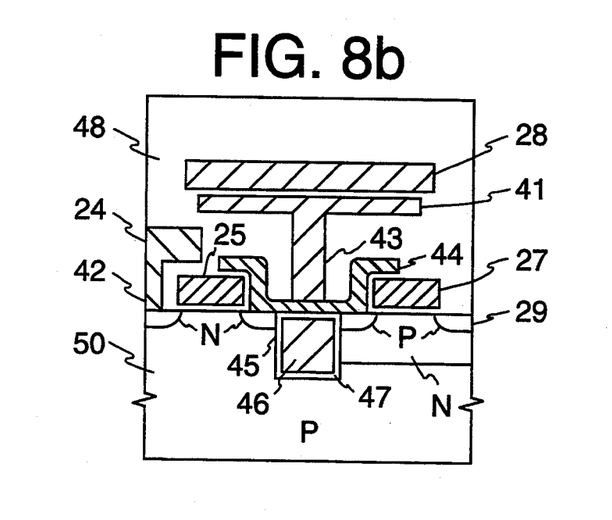

FIG. 7 shows a second embodiment of the dynamic memory according to the present invention. It differs from the embodiment of FIG. 1 in that the storage node precharge circuit 30 is of complimentary conductivity type (i.e. P-channel) to the DRAM cell access transistor. Those skilled in the art will understand many physical layouts and constructions of the second embodiment are also possible. FIG. 8a is an illustrative top view representation of one possible layout using conventional polycrystalline silicon gate and plate technology. Only a small portion of the repetitive array is shown, detailing one dynamic memory cell and precharge circuit. FIG. 8b is a simplified constructional cross section indicated in FIG. 8a, cutting one dynamic memory cell and precharge circuit. FIGS. 8a and 8b are analogous to FIGS. 2a and 2b respectively, with the same reference numeral identifications. Because FIG. 8 contains complimentary device structures, some additional reference numeral identifications are made, An isolation trench 45 in the semiconductor separates N-channel from P-channel regions. Trench 45 can be filled with dielectric, in which case regions 46 and 47 are dielectric, such as silicon dioxide. Trench 45 can also be polycrystalline silicon filled, with a dielectric liner and cap, in which case region 46 is polycrystalline silicon and region 47 is dielectric. In either case, trench 45 is a well known isolation structure, and is generally deeper than isolation regions 40. Region 44 is a conductive connection between the N type diffusion of the cell access transistor and the P type diffusion of the storage node precharge transistor. Titanium nitride is known to be a suitable material for this purpose, and makes acceptably ohmic contacts to both N and P type diffusions. A thin titanium silicide interface layer between titanium nitride and silicon is often used.

Figure 9:
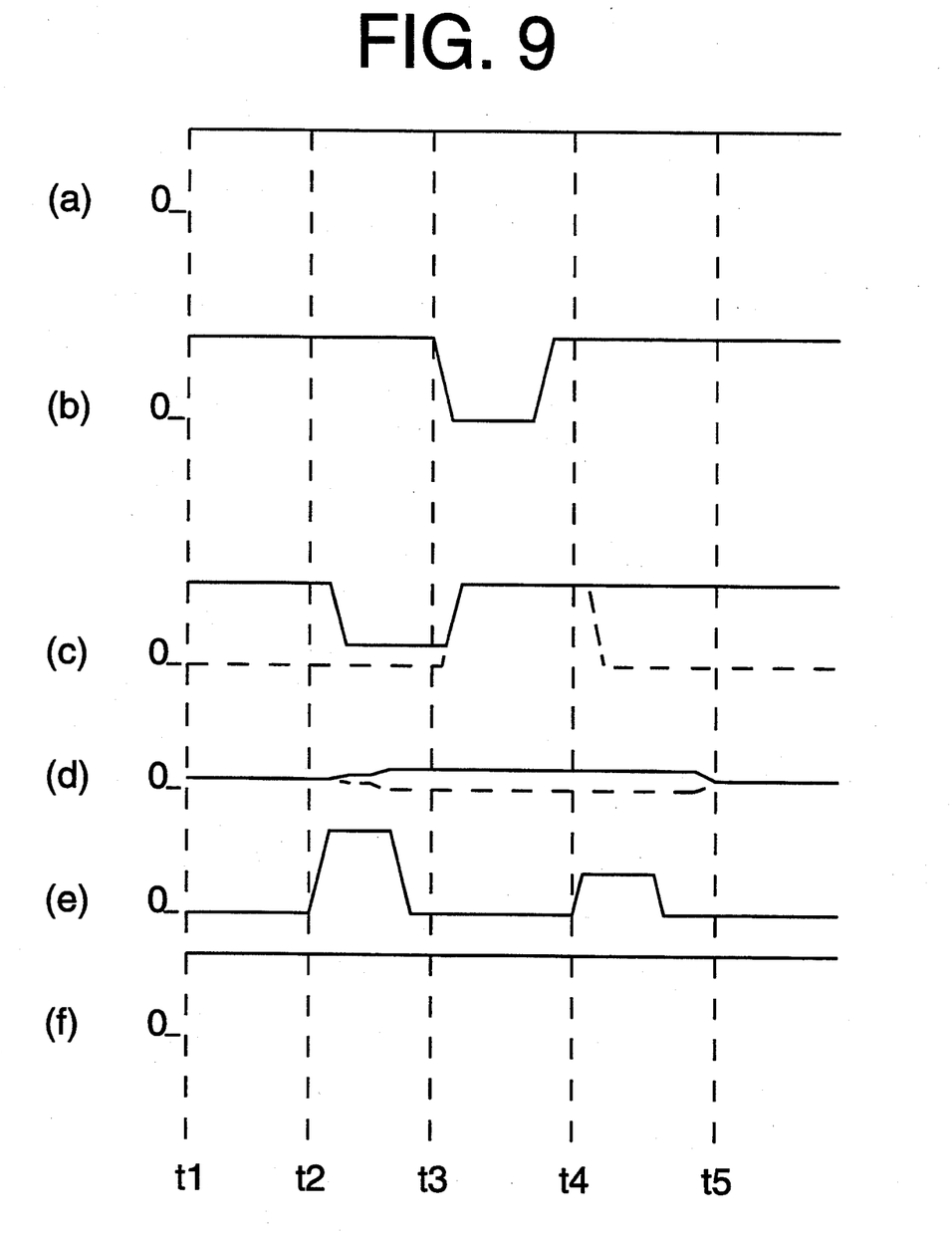

FIG. 9 shows one example of operating waveforms for the second embodiment of the present invention. FIGS. 9a thru 9f correspond to FIGS. 3a thru 3f. The details of the waveforms are modified to meet the operating requirements of the p-channel precharge circuit. Note both the precharge voltage line, FIG. 9a, and the plate line voltage, FIG. 9f, are at a constant high level. Therefore in this case these two lines need not be electrically separate lines, or even lines at all. Indeed, precharge voltage and plate lines may be connected together in a two dimensional plate like configuration across the entire array. Such an interconnection can simplify array physical structures and ease fabrication. In FIG. 9, time intervals t1 thru t5 denote the same functions as the same intervals in FIG. 3.

Figure 10:
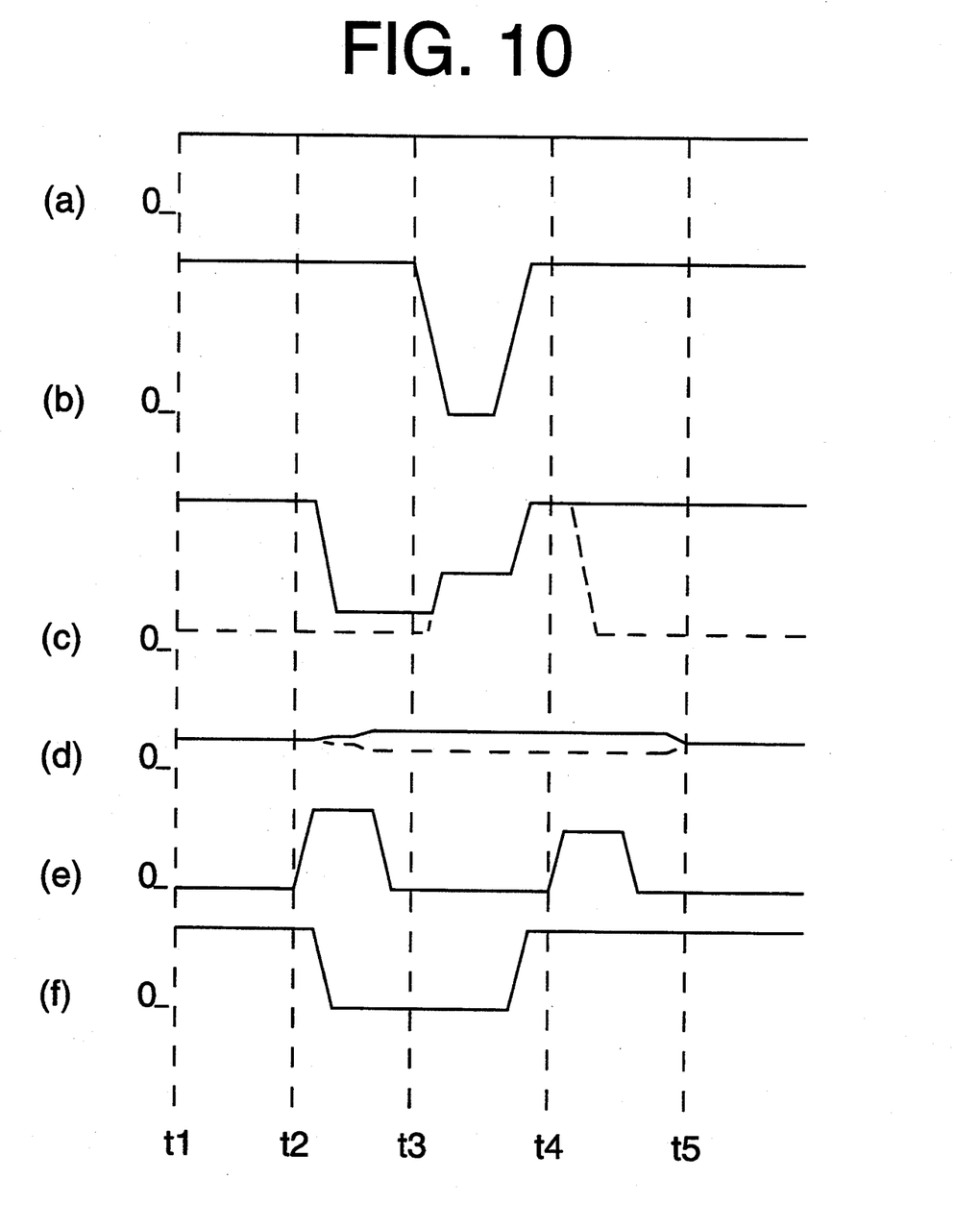

FIG. 10 shows a second example of operating waveforms for the second embodiment of the present invention. FIGS. 10a to 10f correspond to FIGS. 6a to 6f. Like FIG. 6, FIG. 10 illustrates a case in which the bit line low voltage level is always biased above ground so no array back bias generator is needed for the N-channel access transistors. In FIG. 10b note the precharge word line off (high) level is boosted to the storage node high voltage level. This is necessary to keep high storage node levels from leaking down thru the P-channel precharge transistors.

Based on the foregoing descriptions, those skilled in the art will recognize both embodiments of the present invention can be operated using a variety of boosted voltage levels and plate line pulses without departing from the spirit and scope of the invention. Similarly, both embodiments of the present invention can be configured using complimentary transistor types to those specifically described above, also without departing from the spirit and scope of the invention. Such complimentary configurations clearly require corresponding changes in the operating waveforms.

What is claimed is:

1. In a memory device of the FET dynamic random access type including a matrix of memory cells arranged in rows and columns, each said cell comprising at least an access transistor and a memory capacitor having a storage node plate and a reference plate, a plurality of access word lines arranged in a column direction of said matrix, and a plurality of bit lines arranged in a row direction, the improvement comprising:

(a) a storage node precharge circuit, said precharge circuit comprising at least one precharge transistor connected between said storage node plate and a precharge voltage source, each said precharge transistor having a gate connected to one of a plurality of precharge word lines arranged in said column direction of said matrix, and (b) control means for writing a voltage into an addressed column of said cells, including said precharge word line in said addressed column having a first voltage pulse sufficient to cause charging of storage node plates in the addressed column to a first binary data level via said precharge transistors, and selective means for subsequent discharge of cells in said addressed column, including said access wordline in said addressed column having a second voltage pulse sufficient to cause discharge of storage node plates to a second binary data level via said access transistors.

2. The memory of claim 1 wherein said selective means includes an access word line having a said second voltage pulse which is less than an access transistor threshold voltage above a bit line high voltage level and more than an access transistor threshold voltage above a bit line low voltage level.

3. The memory of claim 2 wherein said bit line high voltage level is less than the storage node plate high voltage level.

4. The memory of claim 3 wherein said first binary data level is boosted above said precharge voltage source by capacitive coupling to said reference plate of said memory capacitor.

5. The memory of claim 4 wherein reference plate boosting of said first binary data level occurs during a time when the access word line is not driven.

6. The memory of claim 4 wherein reference plate boosting of said first binary data level occurs after the rise of said first voltage pulse on said precharge word line and before the fall of said second voltage pulse on said access word line.

7. The memory of claim 4 wherein said second binary data level is a voltage above a ground potential, and having an array back bias voltage at said ground potential.

8. The memory of claim 7 wherein the precharge circuit transistor is of complimentary conductivity type to the access transistor, and the precharge word line is boosted in the off condition.

9. The memory of claim 4 wherein the precharge circuit transistor is of complimentary conductivity type to the access transistor, and the precharge word line is boosted in the off condition.

* * * * *

UNITED STATES PATENT AND TRADEMARK OFFICE
CERTIFICATE OF CORRECTION

PATENT NO. : 5,414,656

DATED : May 9, 1995

INVENTOR(S) : Donald M. Kenney

It is certified that error appears in the above-indentified patent and that said Letters Patent is hereby corrected as shown below:

Col. 2, line 16, change "give" to "---given---."

Col. 5, line 45, change "high" to "---higher---."

Col. 6, line 5, change "connected" to "---connecting---."

Signed and Sealed this

Twenty-fifth Day of July, 1995

Attest:

BRUCE LEHMAN

*Attesting Officer*     *Commissioner of Patents and Trademarks*